United States Patent
Greene et al.

(10) Patent No.: US 10,971,216 B2
(45) Date of Patent: Apr. 6, 2021

(54) SRAM CONFIGURATION CELL FOR LOW-POWER FIELD PROGRAMMABLE GATE ARRAYS

(71) Applicant: Microsemi SoC Corp., San Jose, CA (US)

(72) Inventors: Jonathan W. Greene, Palo Alto, CA (US); John McCollum, Orem, UT (US)

(73) Assignee: Microsemi SoC Corp., Chandler, AZ (US)

( * ) Notice: Subject to any disclaimer, the term of this patent is extended or adjusted under 35 U.S.C. 154(b) by 0 days.

(21) Appl. No.: 16/178,093

(22) Filed: Nov. 1, 2018

(65) Prior Publication Data

US 2019/0172522 A1 Jun. 6, 2019

Related U.S. Application Data

(60) Provisional application No. 62/594,349, filed on Dec. 4, 2017, provisional application No. 62/594,481, filed on Dec. 4, 2017.

(51) Int. Cl.
G11C 11/412 (2006.01)
H03K 19/1776 (2020.01)
G11C 11/419 (2006.01)

(52) U.S. Cl.
CPC ........ *G11C 11/412* (2013.01); *H03K 19/1776* (2013.01); *G11C 11/419* (2013.01)

(58) Field of Classification Search
CPC ..... G11C 11/41; G11C 11/412; G11C 11/417; G11C 11/419
USPC ..................................... 365/156, 154, 189.2
See application file for complete search history.

(56) References Cited

U.S. PATENT DOCUMENTS

| 6,090,652 | A | 7/2000 | Kim | |
| 7,470,951 | B2* | 12/2008 | Mathew | H01L 27/11 257/327 |
| 2002/0016081 | A1 | 2/2002 | Aloni et al. | |
| 2002/0020891 | A1 | 2/2002 | Madurawe et al. | |
| 2003/0107913 | A1* | 6/2003 | Nii | G11C 11/412 365/154 |
| 2007/0274124 | A1* | 11/2007 | Otsuka | G11C 11/417 365/154 |
| 2012/0069636 | A1* | 3/2012 | Pelley | G11C 11/413 365/154 |
| 2013/0175611 | A1 | 7/2013 | Shinohara et al. | |
| 2013/0214353 | A1* | 8/2013 | Ito | H01L 29/1045 257/336 |
| 2014/0363960 | A1 | 12/2014 | Kim et al. | |
| 2015/0229307 | A1 | 8/2015 | Badrudduza et al. | |
| 2018/0069534 | A1* | 3/2018 | Sugahara | H03K 3/3565 |

(Continued)

FOREIGN PATENT DOCUMENTS

EP 3166137 A1 5/2017

*Primary Examiner* — Alfredo Bermudez Lozada

(74) *Attorney, Agent, or Firm* — Glass and Associates; Kenneth Glass; Kenneth D'Alessandro

(57) ABSTRACT

A random-access memory cell includes first and second voltage supply nodes, first and second complementary output nodes, first and second complementary bit lines associated with the memory cell, and a word line associated with the memory cell. Pairs of series-connected cross-coupled p-channel and n-channel hybrid FinFET transistors are connected between the voltage supply nodes, the first bit line coupled to the first output node, and the second bit line coupled to the second output node.

7 Claims, 6 Drawing Sheets

(56) References Cited

U.S. PATENT DOCUMENTS

2019/0172522 A1 6/2019 Greene et al.
2019/0172756 A1 6/2019 McCollum et al.

* cited by examiner

| Node | Read Mode | Pgm Mode "On" | Pgm Mode "Off" |
|---|---|---|---|
| $V_{OD}/V_{DD}$ (20) | $V_{OD}$ | $V_{DD}$ | $V_{DD}$ |
| WL (36) | $V_{DD}$ | $V_{DD}$ | $V_{DD}$ |
| BL (38) | $V_{DD}/2$ | $V_{DD}$ | 0 |
| BL! (32) | $V_{DD}/2$ | 0 | $V_{DD}$ |

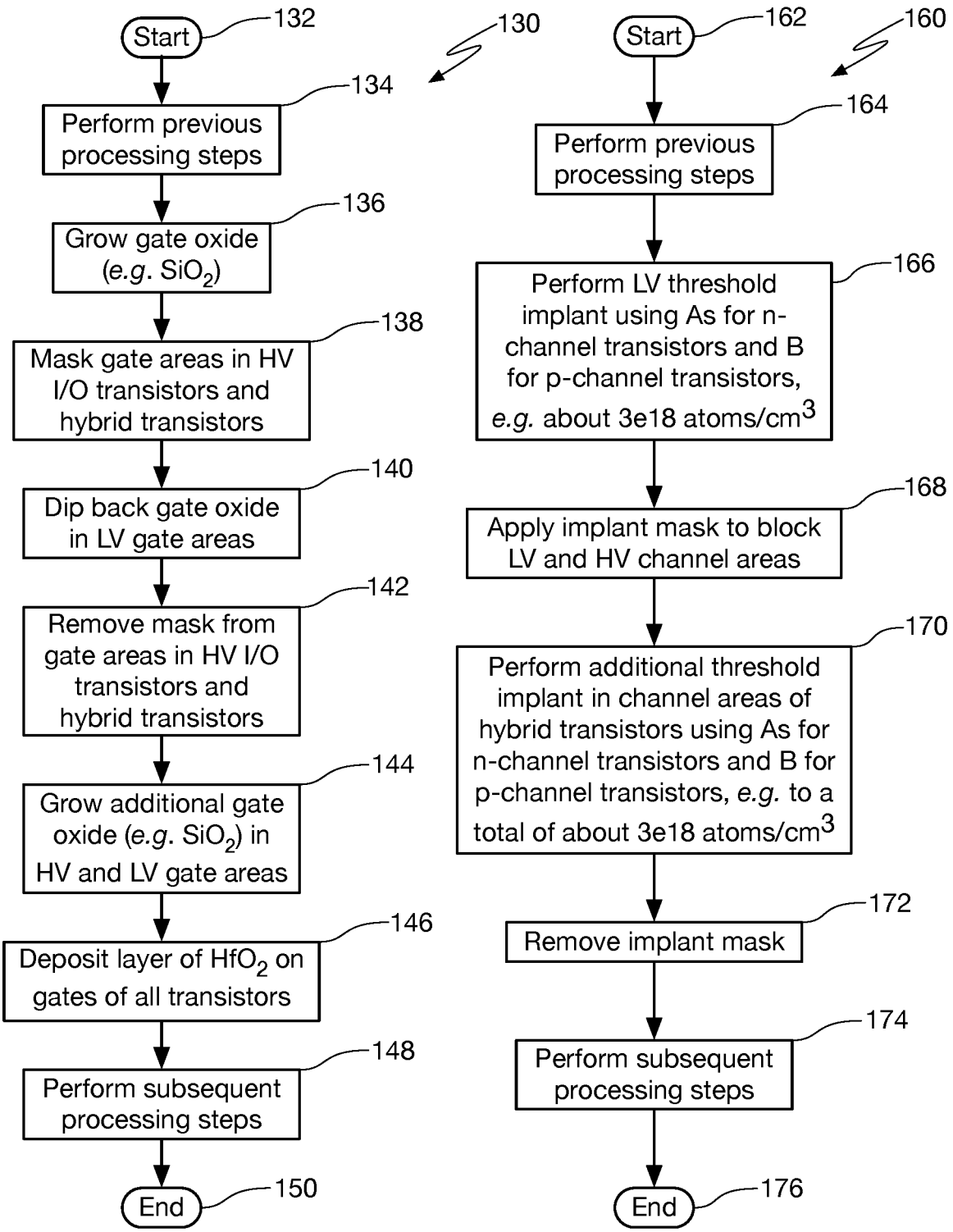

SRAM CONFIGURATION CELL FOR LOW-POWER FIELD PROGRAMMABLE GATE ARRAYS

BACKGROUND

The present invention relates to user-programmable integrated circuits such as field programmable gate array integrated circuits. More particularly, the present invention relates to static random-access memory (SRAM) configuration memory cells for use in user-programmable integrated circuit devices such as field programmable gate array (FPGA) integrated circuits.

FIG. 1 shows a prior-art 6-transistor SRAM configuration memory cell driving the gate of an n-channel switch transistor for use in a user-programmable integrated circuit such as an FPGA. The SRAM configuration memory cell includes a first p-channel transistor in series with a first n-channel transistor between $V_{DD}$ and ground. The gates of the first p-channel transistor and the first n-channel transistor are connected together. The drains of the first p-channel transistor and the first n-channel transistor are connected together to define a first data node Y.

A second p-channel transistor is connected in series with a second n-channel transistor between $V_{DD}$ and ground, having their gates connected together. The drains of the second p-channel transistor and the second n-channel transistor are connected together to define a second data node Y!. The gates of the first p-channel and n-channel transistor are connected to the second data node Y! and the gates of the second p-channel and n-channel transistors are connected to the first data node Y. The type of SRAM configuration memory cell depicted in FIG. 1 is sometimes referred to in the art as a cross-coupled memory cell.

The first data node Y is coupled to a first bitline BL! associated with the SRAM configuration memory cell through an n-channel transistor having its gate connected to a wordline WL associated with the memory cell. The second data node Y! is coupled to a second bitline BL associated with the SRAM configuration memory cell through an re-channel transistor having its gate connected to the wordline WL associated with the SRAM configuration memory cell. The first and second bitlines BL!, BL are complementary.

The n-channel switch transistor switch has its gate connected to the second data node Y! and is used to selectively connect one signal to another in the programmable routing of the FPGA, as controlled by the state of the SRAM configuration memory cell. The transistors in the 6-transistor SRAM configuration memory cell of FIG. 1 are all ordinary low-voltage transistors. The supply voltage is the normal logic supply voltage $V_{DD}$.

There are a few drawbacks to the use of the memory cell of FIG. 1. First, the re-channel switch transistor cannot pass a full $V_{DD}$ voltage, but only $V_{DD}$ less a voltage $V_t$, where $V_t$ is the threshold voltage of the n-channel switch transistor.

The n-channel switch transistor must have a relatively low $V_t$ in order to provide good speed. An undesirable consequence of using a transistor having a low $V_t$ is that the n-channel switch transistor will leak current from its source to drain terminals even when its gate is at ground and the device is shut off. This unnecessarily contributes to the static power consumption of the FPGA.

One solution to these problems is to supply the SRAM configuration memory cell with a voltage $V_{OD}$ selected to be higher than $V_{DD}$ so that the gate of the switch is overdriven to a voltage above $V_{DD}$. To withstand the higher voltage, the planar transistor devices used in the SRAM configuration memory cell are made having both a thicker gate oxide layer to provide a higher maximum $V_{GS}$ breakdown voltage for the higher gate voltages being encountered, and a longer channel to prevent punch-through at the higher drain to source voltages being encountered. The n-channel planar switch transistor driven by the SRAM configuration memory cell uses a thicker oxide to withstand the voltages to which its gate will be subjected but still has the ordinary channel length because it is a low-voltage device. This solution to the prior art problem is described in Telikepalli, "Power vs. Performance: The 90 nm Inflection Point," Xilinx White Paper, 2006. This document is found at https://www.xilinx.com/support/documentation/white_papers/wp223.pdf. As disclosed in Telikepalli, the gate oxide layer used in the switch transistor is thicker than the gate oxide layer used in the standard logic devices but still thinner than the gate oxide used in standard I/O devices, in order not to impact switching speed, meaning that it must be formed using an additional oxide formation step not present in the standard process flow.

This arrangement disclosed in Telikepalli addresses the three issues mentioned above, but introduces new problems. First, the long channel devices in the SRAM configuration memory cell takes up extra die area on the integrated circuit. In addition, the need to provide a device having an additional medium-thickness oxide for the SRAM configuration memory cell complicates the manufacturing process. As technology has advanced to feature sizes below 40 nm, and transistor geometry has evolved from planar geometry to FinFET geometry, it is no longer feasible to provide such non-standard medium thickness oxide devices. A reason for this is the advent of high-k gate processes such as the ones described in https://www.eecg.toronto.edu/~charlesc/chaisson_fpl2013.pdf. Below 20 nm, when process technology changes from planar to FinFET transistors, it becomes even more difficult to continue to support a special non-standard medium-thickness oxide. As a result, at 20 nm FPGA manufacturers have started using CMOS transmission gates as switches. These do not require overdriving the gates to pass a full $V_{DD}$.

FIG. 2 shows a prior-art 6-transistor SRAM configuration memory cell identical to the SRAM configuration memory cell shown in FIG. 1 driving the gates of an n-channel transistor switch and a p-channel transistor connected together to form a conventional CMOS transmission gate, also known as a pass-gate, for use in a user-programmable integrated circuit such as an FPGA. As in the SRAM configuration memory cell of FIG. 1, the transistors are all ordinary low-voltage transistors. The use of a complementary pair of n-channel and p-channel transistors as the switch solves the problem of not passing a full $V_{DD}$ voltage. However, because a pair of devices instead of a single device is used, the area of the switch is increased, and the leakage is not improved. Furthermore, the need to bring both the true (Y) and complement (Y!) data nodes of the SRAM configuration memory cell to the switch devices requires a significant increase in layout area due to additional metal layer wiring requirements.

For a discussion of the tradeoffs of using pass-gates in FPGAs, see: https://www.eecg.toronto.edu/~charlesc/chaisson_fpl2013.pdf In summary, it would be very desirable to find a way to continue to use NMOS switches with overdriven gates but without making the process technology more complex and without increasing the area of the SRAM configuration memory cell too much.

BRIEF DESCRIPTION

According to one aspect of the present invention, a SRAM configuration memory cell includes first and second voltage supply nodes, first and second complementary data nodes, first and second complementary bit lines associated with the SRAM configuration memory cell, and a word line associated with the memory cell. Pairs of series-connected cross-coupled p-channel and n-channel hybrid FinFET transistors are connected between the voltage supply nodes, the first bit line coupled to the first data node, and the second bit line coupled to the second data node.

According to another aspect of the present invention, control circuitry coupled to the SRAM configuration memory cell is configured to supply a programming potential to the first voltage supply node during a programming mode and supply an operating potential higher than the programming potential during an operating mode.

According to another aspect of the present invention, a method of operating a SRAM configuration memory cell formed from pairs of series-connected cross-coupled p-channel and n-channel hybrid FinFET transistors coupled to a pair of complementary bit lines through a pair of hybrid FinFET select transistors includes during a programming mode of operation powering the SRAM configuration memory cell with a first voltage potential and placing one of the first potential and 0V on a first one of the bit lines and the other one of the first potential and 0V on a second one of the bit lines, and during a read mode of operation powering the SRAM configuration memory cell with a second voltage potential higher than the first voltage potential and placing about half of the second voltage potential on both of the complementary bit lines.

According to another aspect of the present invention, an integrated circuit includes a plurality of first SRAM configuration memory cells each including first and second voltage supply nodes, first and second complementary data nodes, first and second complementary bit lines associated with each first memory cell, and a word line associated with each first SRAM configuration memory cell. Each first SRAM configuration memory cell further including pairs of series-connected cross-coupled p-channel and n-channel hybrid FinFET transistors connected between the voltage supply nodes, the first bit line coupled to the first data node, and the second bit line coupled to the second data node. A plurality of second SRAM configuration memory cells each including first and second voltage supply nodes, first and second complementary data nodes, first and second complementary bit lines associated with each first SRAM configuration memory cell, and a word line associated with each first SRAM configuration memory cell. Each second SRAM configuration memory cell further including cross-coupled p-channel and n-channel hybrid FinFET transistors connected between the voltage supply nodes, the first bit line coupled to the first data node, and the second bit line coupled to the second data node.

BRIEF DESCRIPTION OF THE DRAWING FIGURES

The invention will be explained in more detail in the following with reference to embodiments and to the drawing in which are shown:

FIG. 12 is a flow diagram showing an illustrative gate dielectric processing sequence used to fabricate the hybrid FinFET transistor devices of the present invention along with low-voltage and high-voltage FinFET transistor devices.

FIG. 13 is a flow diagram showing an illustrative threshold implant processing sequence used to fabricate the hybrid FinFET transistor devices of the present invention along with low-voltage and high-voltage FinFET transistor devices.

DETAILED DESCRIPTION

Persons of ordinary skill in the art will realize that the following description of the present invention is illustrative only and not in any way limiting. Other embodiments of the invention will readily suggest themselves to such skilled persons.

Figures 3A, 3B:
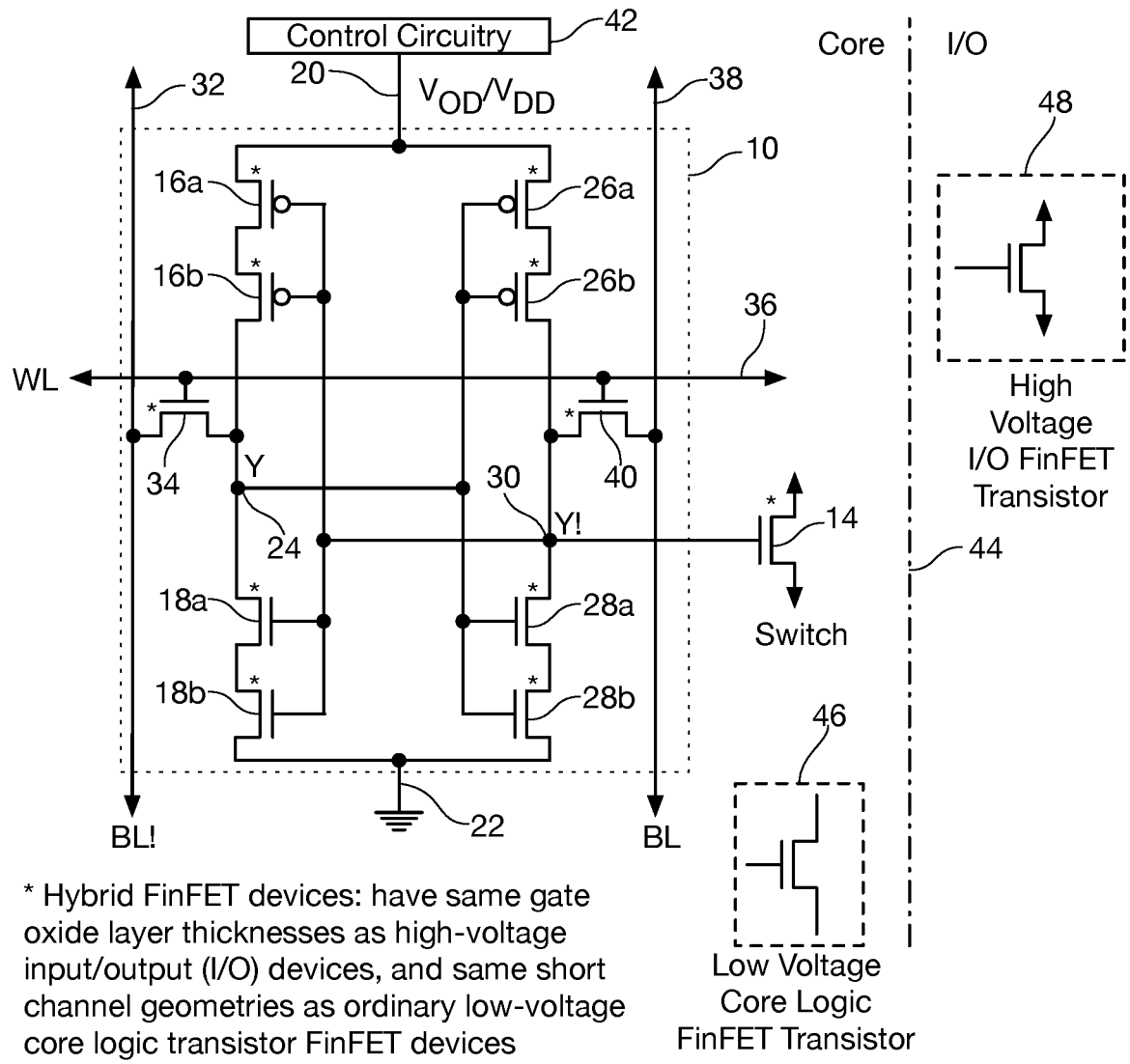
FIG. 3A is a schematic diagram of an SRAM configuration memory cell in accordance with one aspect of the present invention.
FIG. 3B is a table listing the potentials applied to the various nodes of the SRAM configuration memory cell of FIG. 3A in read mode (normal operating mode), and the two cases of programming mode.

Referring now to FIG. 3A, a 10-transistor static random-access memory (SRAM) configuration memory cell (shown within dashed region 10) driving the gate of an re-channel transistor switch 14 for use in a user-programmable integrated circuit such as an FPGA is shown. It is to be understand that a configuration memory cell does not require high speed switching, since the cell is set at initial configuration, and is generally not changed thereafter. The SRAM configuration memory cell 10 includes a first pair of series-connected p-channel FinFET transistors 16a and 16b in series with a first pair of series-connected n-channel FinFET transistors 18a and 18b disposed between two voltage supply rails 20 and 22. The drains of the second of the first pair of series-connected p-channel FinFET transistors 16b and the first of the first pair of series-connected re-channel FinFET transistors 18a are connected together to define a first data node Y at reference numeral 24.

A second pair of series-connected p-channel FinFET transistors 26a and 26b in series with a second pair of series-connected n-channel FinFET transistors 28a and 28b is disposed between the two power rails 20 and 22. The drains of the second of the second pair of series-connected p-channel FinFET transistors 26b and the first of the second pair of series-connected n-channel FinFET transistors 28a are connected together to define a second data node Y! at reference numeral 30.

Persons of ordinary skill in the art will readily appreciate that data nodes Y at reference numeral 24 and Y! at reference numeral 30 are complementary data nodes and that one or both can be connected to circuitry such as switch transistors, LUTs, and other elements to be driven by the SRAM configuration memory cell. It is, however, the usual case that only one of the data nodes will be used to drive a circuit element such as the gate of a switch transistor shown in FIG. 3 driven by the Y! data node 30.

The gates of the first pair of series-connected p-channel FinFET transistors 16a and 16b and the first pair of series-connected n-channel FinFET transistors 18a and 18b are connected to the second data node Y! at reference numeral 30. The gates of the second pair of series-connected p-channel FinFET transistors 26a and 26b and the second pair of series-connected n-channel FinFET transistors 28a and 28b are connected to the first data node Y at reference numeral 24. Like the memory cell of FIGS. 1 and 2, the arrangement of SRAM configuration memory cell 10 of FIG. 3A can be referred to as being cross-coupled.

The first data node Y at reference numeral 24 is coupled to a first bitline 32 (BL!) associated with the SRAM configuration memory cell 10 through an n-channel select transistor 34 having its gate connected to a wordline (WL) 36 associated with the SRAM configuration memory cell 10. The second data node Y! at reference numeral 30 is coupled to a second bitline 38 (BL) associated with the SRAM configuration memory cell 10 through an n-channel select transistor 40 having its gate connected to the wordline (WL) 36 associated with the SRAM configuration memory cell 10. The first and second bitlines BL! (32) and BL (38) are complementary.

The n-channel FinFET transistor switch 14 has its gate connected to the second data node Y! (30) and is used to selectively connect one signal to another in the programmable routing of the FPGA, as controlled by the state of the SRAM configuration memory cell 10.

The terms "low-voltage" and "high-voltage" are used herein to characterize transistor devices having different structures that allow operation at different voltage levels. In any given semiconductor foundry that fabricates integrated circuits for customers, there are specifications for both "low-voltage" and "high-voltage" transistors that take into account minimum process feature sizes as well as operating voltage specifications. Low-voltage core logic FinFET transistors are used for logic in the core of an integrated circuit device while high-voltage FinFET transistors are used as I/O devices in the integrated circuits. FIG. 3A shows a dashed line 44 separating the core area of an integrated circuit in which the 10-transistor static random-access memory (SRAM) configuration memory cell resides along with a low-voltage core logic FinFET transistor from an unrelated circuit which is shown within dashed line box identified by reference numeral 46, and the I/O area in which the input-output (I/O) transistors are formed, one of which is shown within dashed line box identified by reference numeral 48.

The p-channel and n-channel FinFET transistor devices 16a, 16b, 18a, 18b, 26a, 26b, 28a, and 28b are hybrid FinFET transistor devices. Hybrid FinFET transistor devices, as used herein, share three attributes: 1) they have gate oxide layers having the same thicknesses as high-voltage input/output (I/O) transistors; 2) they have the short channel geometries of ordinary low-voltage core logic FinFET transistors in the core area of the integrated circuit; and 3) they have higher channel implant doses than the low-voltage core logic FinFET transistors in the core area of the integrated circuit in order to allow them to withstand the higher operating voltages without suffering from punch through. These hybrid FinFET transistor devices are disclosed in application Ser. No. 62/594,349, filed on the same date as the instant application and entitled "HYBRID HIGH-VOLTAGE LOW-VOLTAGE FINFET DEVICE". This application is incorporated by reference herein in its entirety, and the term "hybrid FinFET transistors" and "hybrid FinFET transistor devices" as used herein are intended to refer to the devices disclosed in the above-identified patent application.

The hybrid FinFET transistor devices used in the SRAM configuration memory cell 10 of the present invention can tolerate a voltage greater than $V_{DD}$ on their gates, yet are no larger than an ordinary low-voltage FinFET device. Unlike the prior-art FinFET devices, the hybrid FinFET devices used in the SRAM configuration memory cell 10 of the present invention do not require any additional "medium-thickness" gate oxide layers or other process changes, and as disclosed in the above-identified patent application, they may be fabricated using existing processes with the addition of only minimal adjustments to the process flow, mostly involving the geometry of the masks used in gate formation and channel implant steps of the fabrication process. The hybrid FinFET transistor device is especially suitable for use as a switch in a non-volatile memory user programmable circuit such as an FPGA, where adequate overdrive voltage is readily available for the non-volatile memory configuration memory cell.

As disclosed in the above-identified patent application, hybrid FinFET transistor devices can also be made having p-channel polarity. The goal is to have an SRAM configuration memory cell that can provide sufficient overdrive to use a hybrid switch device, but without complicating the manufacturing process with additional requirements for new devices. Furthermore, the SRAM configuration memory cell should consume as little die area as possible.

The first aspect of the invention is to form the SRAM configuration memory cell 10 from the same hybrid FinFET transistor devices used for the switch transistor 14. This avoids any need for a large spacing between the configuration bits and switches. The hybrid devices can withstand the elevated gate voltage due to their thick oxide. However the hybrid FinFET transistor devices still cannot withstand the source-drain voltages encountered in the memory cell itself without undue leakage that can otherwise inadvertently switch the state of the memory cell.

According to another aspect of the present invention, and as illustrated in the Table of FIG. 3B, exceeding $V_{DD}$ across the source and drain of the select transistors 34, 40 in the SRAM configuration memory cell 10 is avoided. During normal operating conditions (read mode) the memory cell 10 is powered by $V_{OD}$, which can be, for example, 1.5V. During programming (write mode) the voltage powering the memory cell 10 is reduced to $V_{DD}$, for example 0.8V to allow the use of a single transistor as select transistors 34 and 40. Prior to writing data to the SRAM configuration memory cell 10, control circuit 42 coupled to power rail 20 drops $V_{OD}$ to $V_{DD}$, and then the SRAM configuration memory cell 10 is written to as usual by setting WL 36 and bitlines BL! 32 and BL 38 to appropriate voltages of 0 or $V_{DD}$ as known in the art. To program SRAM configuration memory cell 10 to turn on the hybrid FinFET transistor switch 14, control circuit 42 coupled to power rail 20 sets node 20 to $V_{DD}$, WL 36 is set to $V_{DD}$ BL 38 is set to $V_{DD}$ and BL! 32 is set to 0V as shown in the table of FIG. 3B. To program SRAM configuration memory cell 10 to turn off the hybrid FinFET transistor switch 14, control circuit 42 coupled to power rail 20 sets node 20 to $V_{DD}$, WL 36 is set to $V_{DD}$, BL 38 is set to 0V and BL! 32 is set to $V_{DD}$ as also shown in the table of FIG. 3B.

During a read mode (normal operation) of the SRAM configuration memory cell 10 or other user-programmable circuit designed using the principles set forth herein, control circuit 42 sets the voltage on power rail 18 to $V_{OD}$ to overdrive the gate of switch transistor 14, but the bit lines 32 and 38 are maintained at $V_{DD}/2$ to avoid undue leakage through the select devices as also shown in the table of FIG. 3B. Configuration and control of circuits such as control circuitry 42 is well known in the art.

This leaves only the remaining FINFET transistors in the SRAM configuration memory cell 10 exposed to source-drain voltages above $V_{DD}$ during normal circuit operation (i.e., read operation). To avoid this problem, two transistors 16a, 16b, 18a, 168, 26a, 26b, and 28a, 28b are provided in series in place of a single transistor shown in the prior art SRAM cell of FIG. 1. Thus $V_{OD}$ is divided across two off-state devices, and neither of the off-state devices sees a source-drain voltage in excess of $V_{OD}/2$. During operation, with the bit lines at $V_{DD}/2$, the SRAM configuration memory cell 10 can be supplied by $V_{OD}$ with no risk of exceeding the limit of any of the hybrid FINFET transistors 16a, 16b, 18a, 18b, 26a, 26b, 28a, 28b.

Figure 4:
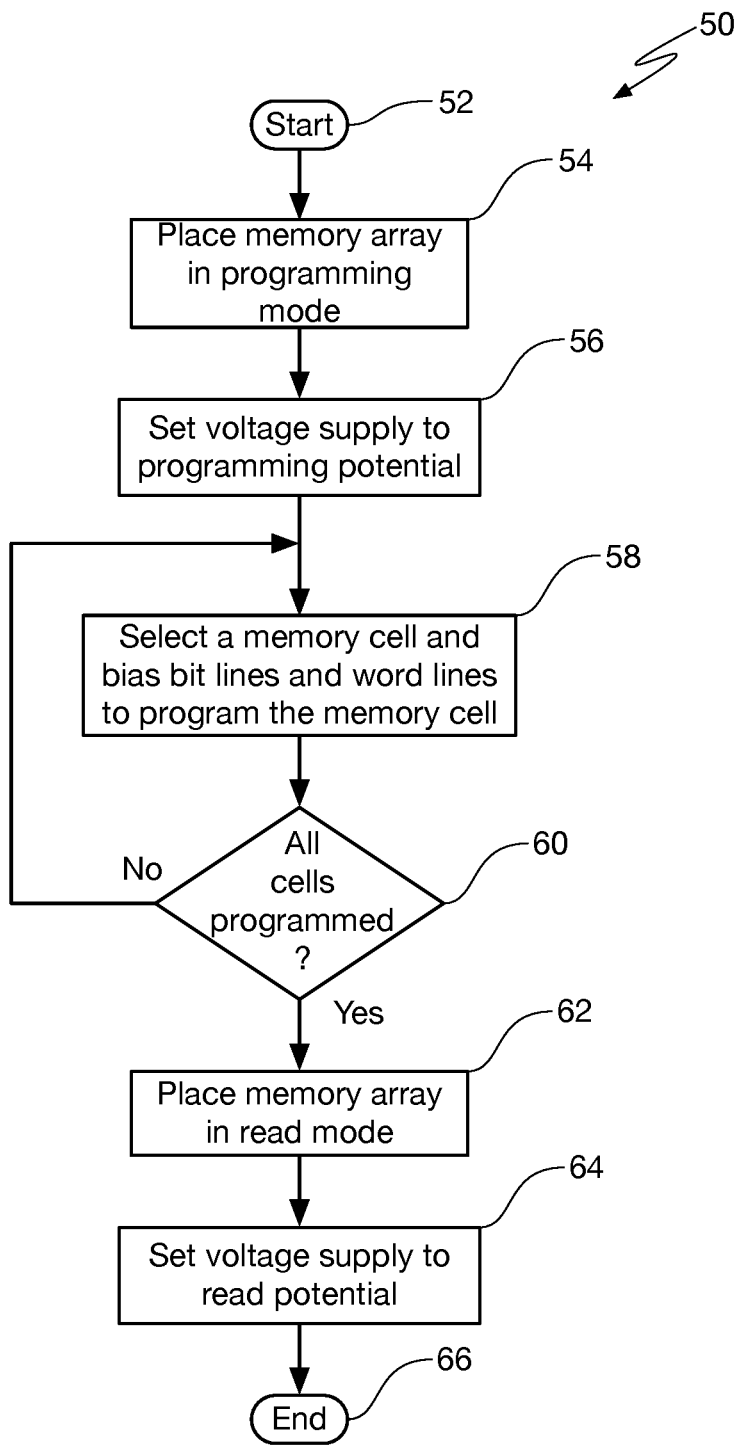
FIG. 4 is a flow diagram showing an illustrative method in accordance with the present invention.

Referring now to FIG. 4, a flow diagram shows an illustrative method for operating an array of the memory cells of the present invention. The method starts at reference numeral 50.

At reference numeral 52 a command places the array in programming mode. This command is asserted at device powerup as well as at other selected times. At reference numeral 56, in response to the command placing the array in programming mode the voltage at the first voltage supply node is set at the programming voltage $V_{DD}$. At reference numeral 58, a memory cell is selected and is programmed by asserting appropriate voltage potentials on the word lines and bit lines of the memory array. As indicated by decision diamond 60, cells are selected and programmed until all of the memory cells in the array have been programmed.

Next, at reference numeral 64, a command places the array in read mode, sometimes referred to as the "normal operating mode" of the memory cell. In response to the command placing the array in programming mode, the voltage at the first voltage supply node is set at the programming voltage $V_{OD}$. The process ends at reference numeral 66.

Further in accordance with the present invention, user-programmable circuits such as FPGA circuits also require some configuration bits that do not drive switch gates, but instead drive logic inputs, and thus need not be driven by a voltage in excess of a $V_t$ above $V_{DD}$. An example would be the $2^N$ bits used to configure an N-input LUT. Normally manufacturers prefer to use the same SRAM configuration memory cell for all purposes (including both controlling the switches and configuring the logic) to simplify the design and manufacturing. However in this context it is preferable to continue to use the smaller prior-art SRAM cell of FIG. 1 to drive the logic, and reserve use of the larger SRAM configuration memory cell 10 of FIG. 2 to those cases where it is necessary to overdrive switch gates.

Persons of ordinary skill in the art will appreciate that, because it is so important to minimize die area, providing two devices in series as in the SRAM configuration memory cell 10 is not the sort of thing that would typically be done in an SRAM configuration memory cell. However, the use of two different types of SRAM cells in the FPGA (the SRAM cell of FIG. 1 where possible and the SRAM configuration memory cell of FIG. 2 where necessary), the area savings from enabling the use of an NMOS hybrid switch instead of a CMOS switch, and reduction of the supply voltage to $V_{DD}$ during write operations to limit the source-drain voltage on the addressing devices and using pairs of series devices for the remaining devices in the SRAM cell can be acceptable as part of an overall solution for FPGA configuration.

Figure 5:
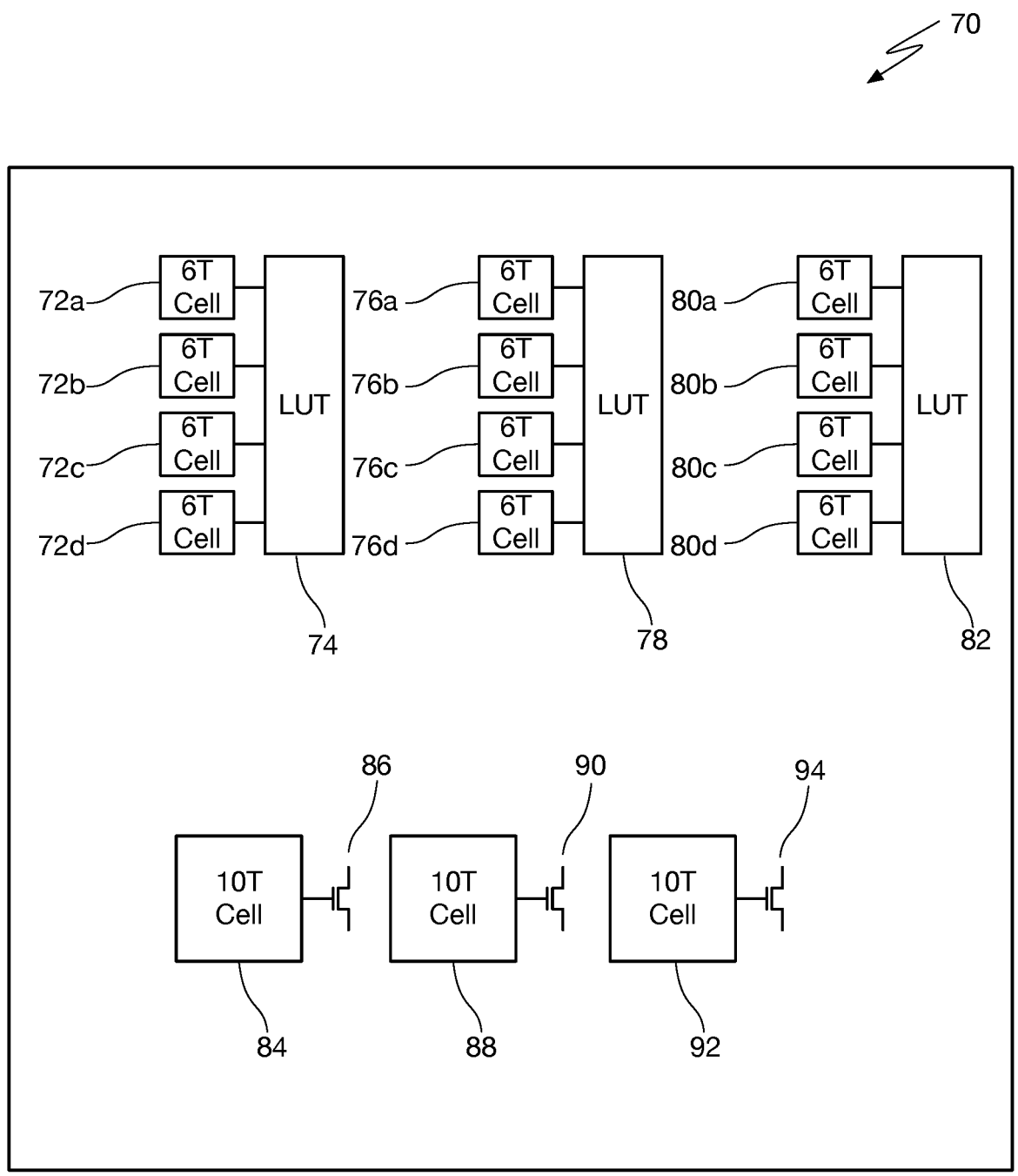
FIG. 5 is a diagram of an integrated circuit 70 having an illustrative arrangement of different SRAM configuration memory cells in accordance with another aspect of the present invention.

This aspect of the invention is shown in FIG. 5, a diagram of an integrated circuit 70 having an illustrative arrangement of different SRAM memory cells in accordance with the present invention. SRAM memory cells 72a, 72b, 72c, and 72d drive inputs to LUT 74 Similarly, SRAM memory cells 76a, 76b, 76c, and 76d drive inputs to LUT 78; and SRAM memory cells 80a, 80b, 80c, and 80d drive inputs to LUT 82. The inputs to LUTs 74, 78, and 82 are logic inputs that do not need to be overdriven. Accordingly, prior-art 6T SRAM cells such as those depicted in FIG. 1 can be employed.

SRAM configuration memory cell 84 drives n-channel switch transistor 86. Similarly, SRAM configuration memory cell 88 drives n-channel switch transistor 90; and SRAM configuration memory cell 92 drives n-channel switch transistor 86. The re-channel switch transistors 86, 90, and 94 connect circuit nets together and need to be overdriven to prevent a $V_t$ drop in the signal path. Consequently, the use of the SRAM configuration memory cell 10 of FIG. 3 is preferred to provide overdrive to the gates of the switch transistors 86, 90, and 94.

Figure 1:
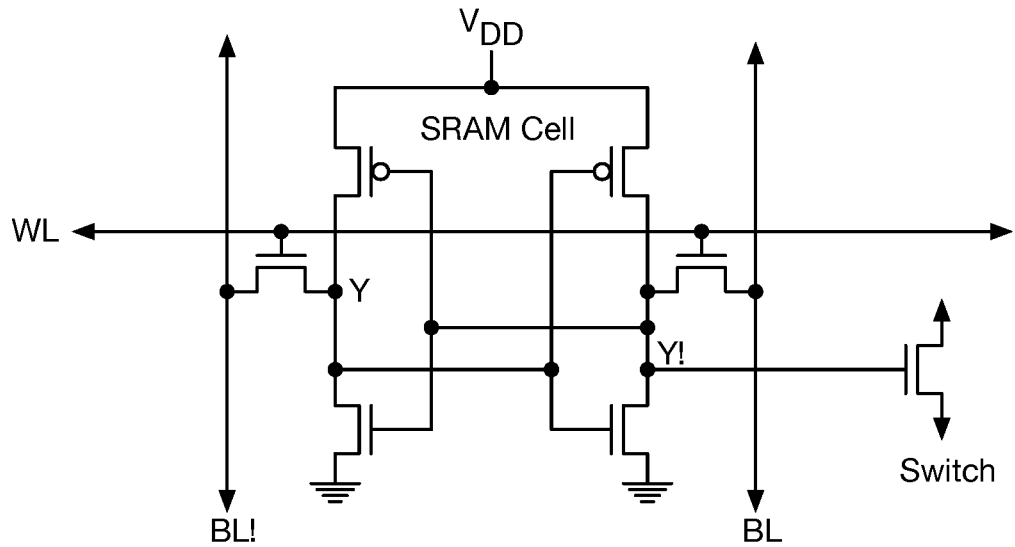
FIG. 1 is a schematic diagram of a prior-art SRAM configuration memory cell.
Figures 6, 7, 8:
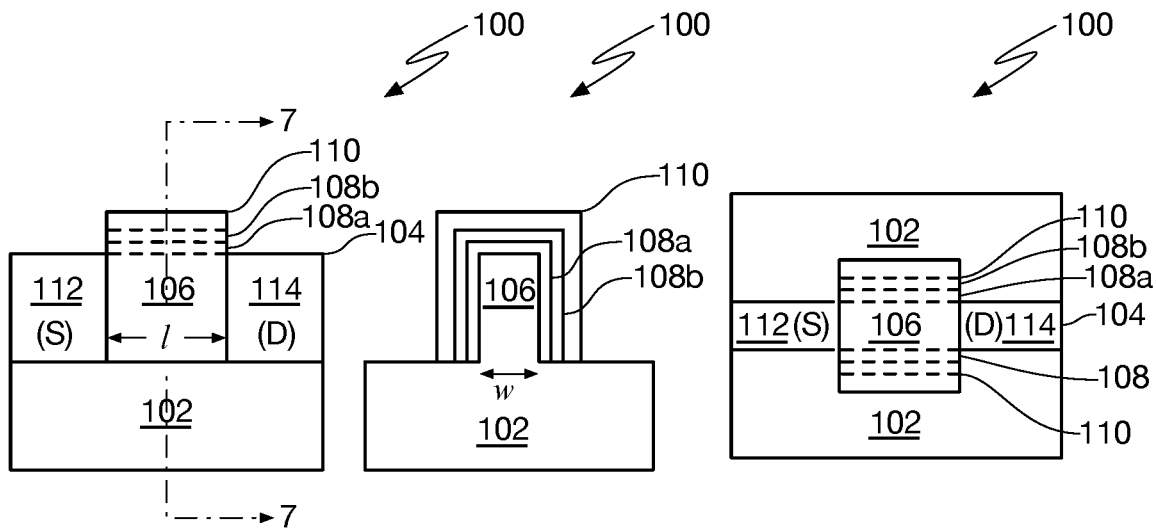
FIG. 6 is a diagram depicting the layout of a prior-art FinFET transistor in a direction along the channel of the device.
FIG. 7 is a diagram depicting a cross sectional view of the layout of the prior-art FinFET device of FIG. 6 across the channel at the lines 7-7.
FIG. 8 is a diagram depicting the top view of the layout of the prior-art FinFET device of FIG. 6.

Referring now to FIGS. 6, 7 and 8, diagrams show the layout of a typical prior-art low-voltage FinFET transistor device 100. FIG. 1 is a diagram depicting the layout of the prior-art FinFET transistor device in a direction along the channel of the device. FIG. 7 is a diagram depicting a cross sectional view of the layout of the prior-art FinFET transistor device 100 of FIG. 6 across the channel at the lines 7-7. FIG. 8 is a diagram depicting the top view of the layout of the prior-art FinFET transistor device 100 of FIG. 6.

FinFET transistor device 100 is an ordinary low voltage FinFET. As known in the art, FinFET transistor device 100 is fabricated on substrate 102 and includes a thin fin of silicon body 104 extending vertically upward from the surface of the substrate 102. In a channel region 106 of the fin 104 a multi-layer gate dielectric formed from a first dielectric layer 108a formed from, for example, thermal $SiO_2$, and a second dielectric layer 108b formed from a high-k material, for example $HfO_2$, surrounds the fin 104. Gate dielectric layers 108a and 108b together have a thickness, such as 8 Å and 36 Å in one particular embodiment, respectively, sufficient to withstand the normal low-voltage gate potential that will be applied to the device. A gate 110 is formed on the second dielectric layer 108b. Gate 110 is formed from a metal such as titanium and/or tantalum, e.g., titanium nitride and/or tantalum nitride.

Figure 2:
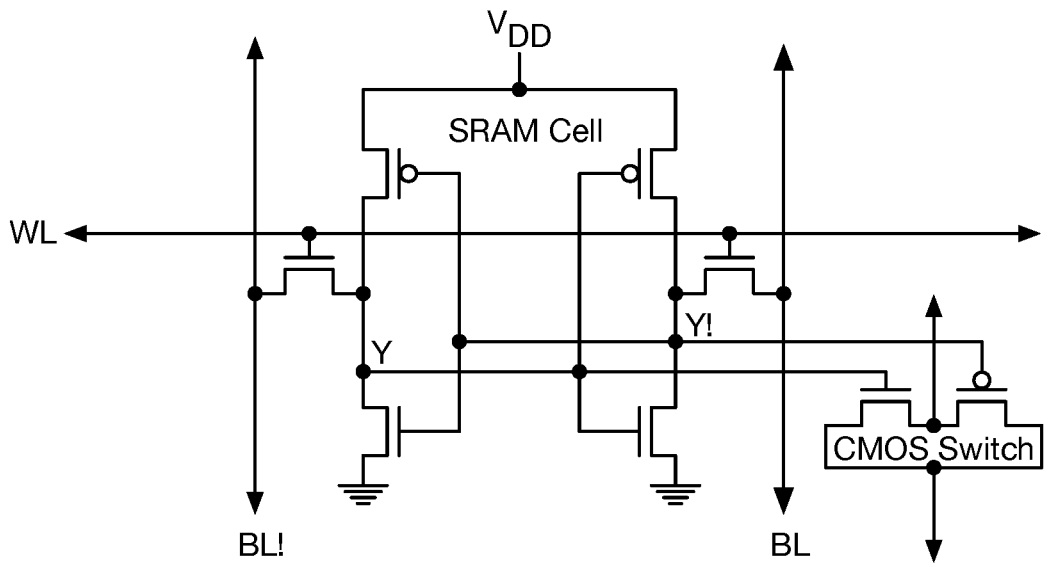
FIG. 2 is a schematic diagram of another prior-art SRAM configuration memory cell.

Persons of ordinary skill in the art will appreciate that in FinFET transistor device 100 the gate 110 is wrapped around the fin 104 on three sides to define the channel, which has a width w and length l, providing excellent control from the three sides (left, right, and top) of the channel as seen in FIG. 2. The portion of the fin 104 extending to the left of the gate 110 in FIG. 1 is the source 112 of the FinFET transistor 100 and the portion of the fin 104 extending to the right of the gate 110 in FIG. 1 is the drain 114 of the FinFET transistor 100. Where the FinFET transistor is an n-channel transistor, the source and drain regions 112 and 114 are implanted with a dopant such as arsenic. Where the FinFET transistor is a p-channel transistor, the source and drain regions 112 and 114 are implanted with a dopant such as boron.

Figures 9, 10, 11:
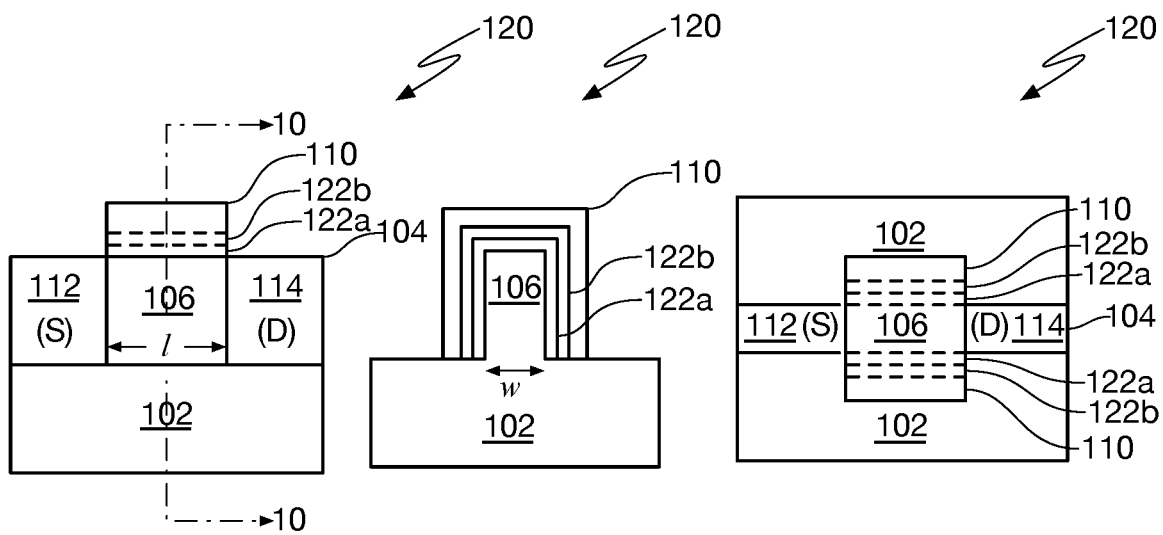
FIG. 9 is a diagram depicting the layout of a hybrid FinFET transistor in accordance with the present invention in a direction along the channel of the device.
FIG. 10 is a diagram depicting a cross sectional view of the layout of the hybrid FinFET transistor device of FIG. 4 across the channel at the lines 10-10.
FIG. 11 is a diagram depicting the top view of the layout of the hybrid FinFET transistor device of FIG. 3.

Referring now to FIGS. 9, 10, and 11, side and top views show a hybrid FinFET transistor device 120 in accordance with one aspect of the present invention, where: FIG. 9 is a diagram depicting the layout of the hybrid FinFET transistor device 120 in a direction along the channel of the device; FIG. 10 is a diagram depicting a cross sectional view of the layout of the hybrid FinFET transistor device 120 of FIG. 9 across the channel at the lines 10-10; and FIG. 11 is a diagram depicting the top view of the layout of the hybrid FinFET transistor device 120 of FIG. 4. Some features of hybrid FinFET transistor device 120 are common to FinFET transistor device 10, and these features will be identified in FIGS. 69-11 using the same reference numerals used in FIGS. 6-8.

Like the prior-art FinFET transistor device 100 of FIGS. 1-3, the hybrid FinFET transistor device 120 of FIGS. 9 through 11 is fabricated on substrate 102 and includes a thin fin of silicon body 104 extending vertically upward from the surface of the substrate 102. In a channel region 106 of the fin 104 a multi-layer gate dielectric formed from a first dielectric layer 122a formed from, for example, thermal $SiO_2$, and a second dielectric layer 122b formed from a high-k material, for example $HfO_2$, surrounds the fin 104. Gate dielectric layers 122a and 122b together have a thickness, such as 30 Å and 36 Å in one particular embodiment, respectively, sufficient to withstand the high-voltage gate potential that will be applied to the device. Gate 110 is formed from a metal such as titanium and/or tantalum, e.g., titanium nitride and/or tantalum nitride.

Persons of ordinary skill in the art will appreciate that in hybrid FinFET transistor device 120 the gate is wrapped around the fin 104 on three sides to define the channel, which has the same width w and length l as the low-voltage FinFET transistor device 100 depicted in FIGS. 7 through 8, providing excellent control from the three sides (left, right, and top) of the channel as seen in FIG. 5. The portion of the fin 104 extending to the left of the gate 110 in FIG. 9 is the source 112 of the hybrid FinFET transistor device 120 and the portion of the fin 104 extending to the right of the gate 110 in FIG. 9 is the drain 114 of the hybrid FinFET transistor device 120. Where the hybrid FinFET transistor device 30 is an n-channel transistor, the source and drain regions 112 and 114 are implanted with a dopant such as arsenic. Where the hybrid FinFET transistor device 120 is a p-channel transistor, the source and drain regions 112 and 114 are implanted with a dopant such as boron.

According to another aspect of the present invention illustrated in FIGS. 12 and 13, the n-channel and p-channel FinFET transistor devices according to the present invention may be fabricated using conventional processing steps currently employed in semiconductor foundries, with a few variations that are compatible with these processes.

Referring now to FIG. 12, a flow diagram shows an illustrative gate dielectric processing sequence 130 that may be used to fabricate the hybrid FinFET transistor device 120 of the present invention along with conventional low-voltage and high-voltage FinFET transistor devices. The process sequence begins at reference numeral 132.

At reference numeral 134, processing steps that precede gate dielectric formation are performed as is known in the art. At reference numeral 136, a layer of dielectric material such as $SiO_2$ is formed over the fin. In one particular embodiment of the invention, this layer is formed to a thickness of about 22 Å. Then, at reference numeral 138 a gate masking layer is applied to the gate regions of both the hybrid FinFET transistors and the high-voltage FinFET transistors being fabricated. The gate oxide layer is then dipped back in the unmasked low-voltage transistors at reference numeral 140. At reference numeral 142, the gate masking layer is removed.

At reference numeral 144 an additional layer of a dielectric such as $SiO_2$ is formed in the gate regions of all low-voltage, hybrid, and high-voltage FinFET transistors. In one particular embodiment of the invention, this layer is formed to a thickness of about 8 Å. Because the initial layer of dielectric material remains on the hybrid FinFET transistors and the high-voltage FinFET transistors, the total thickness of the combination of layers on the hybrid FinFET transistors and on the high-voltage FinFET transistors increases to about 30 Å, while the thickness of the single layer on the low-voltage FinFET transistors is about 8 Å.

At reference numeral 146, a second dielectric layer formed from, for example, $HfO_2$, is formed over of the gate regions of all low-voltage, hybrid, and high-voltage FinFET transistors. In one particular embodiment of the invention, this $HfO_2$ layer is formed to a thickness of about 36 Å. At reference numeral 148, subsequent processing steps are performed to further fabricate the integrated circuit containing the low-voltage, hybrid, and high-voltage FinFET transistors of the present invention. The process ends at reference numeral 150.

As will be appreciated by persons of ordinary skill in the art, the total thickness of the gate dielectric layers in the low-voltage FinFET transistors is about 44 Å and the total thickness of the gate dielectric layers in the hybrid FinFET transistors and the high-voltage FinFET transistors is about 66 Å. There is no additional processing that needs to be performed in the process to form gate dielectric regions for the hybrid FinFET transistors of the present invention. The only change to the process involves altering the geometry of the gate masking layer used to protect the high-voltage transistor gate regions from the dip back of the first dielectric region in the exposed low-voltage transistor gate regions at reference numeral 50 by also covering the gate regions of low-voltage form factor FinFET transistor structures that are going to be hybrid FinFET transistors. This simple change in the geometry of an existing mask already used in the fabrication in the process does not affect, and thus is compatible with, the basic fabrication process.

Referring now to FIG. 13, a flow diagram shows an illustrative threshold implant processing sequence 160 that may be used to fabricate the FinFET transistor devices of the present invention along with low-voltage FinFET transistor devices. The process sequence begins at reference numeral 162.

At reference numeral 164, processing steps that precede threshold channel implant formation are performed as is known in the art. At reference numeral 166, a low-voltage threshold implant is performed for all FinFET transistors in the integrated circuit. Then, at reference numeral 168 an implant masking layer is applied to the substrate to cover the channel regions of the low-voltage and the high-voltage FinFET transistors. The channel regions of the hybrid FinFET transistors remain exposed. At reference numeral 170, an additional channel threshold implant is performed in the exposed channel regions of the hybrid FinFET transistors. At reference numeral 172, the implant masking layer is removed. At reference numeral 174, subsequent processing steps are performed to further fabricate the integrated circuit containing the low-voltage, hybrid, and high-voltage FinFET transistors. The process ends at reference numeral 176.

The process sequence shown in FIG. 8 is generic to a channel threshold implant sequence for both n-channel FinFET and p-channel hybrid FinFET transistors. In a process for fabricating integrated circuits having both n-channel and p-channel hybrid FinFET transistor devices, the channel threshold implant process sequence shown in FIG. 8 is simply performed twice, once for n-channel hybrid transistors and once for p-channel hybrid transistors. In the case of n-channel hybrid transistors, according to one exemplary embodiment of the invention, the channel doping is performed using arsenic to about $3e18$ atoms/cm$^3$ in both low-voltage and high-voltage transistor channels and to about $5e18$ atoms/cm$^3$ in hybrid transistor channels. In the case of p-channel hybrid transistors, according to one exemplary embodiment of the invention, the channel doping is performed using boron to about $3e18$ atoms/cm$^3$ in low-voltage and high-voltage transistor channels and to about $5e18$ atoms/cm$^3$ in hybrid transistor channels.

As will be appreciated by persons of ordinary skill in the art, the only modification to the process that needs to be made in the channel threshold process sequence to implant low-voltage, hybrid, and high-voltage channel threshold implants for FinFET transistors is the application of the implant masking layer to cover the low-voltage and high-voltage transistor channel regions at reference numeral 168, the additional hybrid channel threshold implant performed in the exposed hybrid transistor channel regions at reference numeral 170, and the removal of the implant masking layer at reference numeral 172. As with the high-voltage gate dielectric formation process sequence, this additional processing does not materially affect and thus is compatible with the basic fabrication process. These are acceptable process modifications in that they do not affect other devices and may be implemented at a minimum cost.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A static random-access memory configuration cell for an integrated circuit device that includes an input-output (I/O) FinFET transistor and a core logic FinFET transistor, the static random-access memory configuration cell comprising:
   first and second power supply nodes;
   first and second complementary output nodes;
   first and second complementary bit lines associated with the memory cell;
   a word line associated with the memory cell;
   a first pair of series-connected p-channel hybrid FinFET transistors connected between the first complementary output node and the first power supply node, wherein gates of the first pair of series-connected p-channel hybrid FinFET transistors are connected to the second complementary output node;
   a first pair of series-connected n-channel hybrid FinFET transistors connected between the first complementary output node and the second power supply node, wherein gates of the first pair of series-connected n-channel hybrid FinFET transistors are connected to the second complementary output node;
   a second pair of series-connected p-channel hybrid FinFET transistors connected between the first power supply node and the second complementary output node, wherein gates of the second pair of series-connected p-channel hybrid FinFET transistors are connected to the first complementary output node; and
   a second pair of series-connected n-channel hybrid FinFET transistors connected between the second power supply node and the second complementary output node, wherein gates of the second pair of series-connected n-channel hybrid FinFET transistors are connected to the first complementary output node; and
   wherein the first pair of series-connected p-channel hybrid FinFET transistors, the first pair of series-connected n-channel hybrid FinFET transistors, the second pair of series-connected p-channel hybrid FinFET transistors and the second pair of series-connected n-channel hybrid FinFET transistors, have channels including channel implant doses in the entire channel that are higher than implant doses of the core logic FinFET transistor, have channel geometries that are approximately the same as a channel geometry of the core logic FinFET transistor, and include gate oxide layers having a uniform thickness across the entire channel that are approximately the same thicknesses as a gate oxide layer of the I/O FinFET transistor.

2. The static random-access memory configuration cell of claim 1 further comprising control circuitry configured to supply a programming potential to the first power supply node during a programming mode and supply an operating potential higher than the programming potential during a read mode.

3. The static random-access memory configuration cell of claim 1 further comprising an n-channel hybrid FinFET switch transistor having a gate coupled to one of the first and second complementary output nodes.

4. The static random-access memory configuration cell of claim 1 wherein:
   the first complementary bit line is coupled to the first complementary output node through a first hybrid FinFET select transistor,
   the second complementary bit line is coupled to the second complementary output node through a second hybrid FinFET select transistor, and
   wherein the first hybrid FinFET select transistor and the second hybrid FinFET select transistor include gate oxide layers having approximately the same thicknesses as the gate oxide layer of the I/O FinFET transistor and have channel geometries that are approximately the same as the channel geometry of the core logic FinFET transistor.

5. A static random-access memory configuration cell for an integrated circuit device that includes an input-output (I/O) FinFET transistor and a core logic FinFET transistor, the static random-access memory cell comprising:
   first and second power supply nodes;
   first and second complementary output nodes;
   first and second complementary bit lines associated with the memory cell;
   a word line associated with the memory cell;
   a first pair of series-connected p-channel hybrid FinFET transistors connected between the first complementary output node and the first power supply node, wherein gates of the first pair of series-connected p-channel hybrid FinFET transistors are connected to the second complementary output node;

a first pair of series-connected n-channel hybrid FinFET transistors connected between the first complementary output node and the second power supply node, wherein gates of the first pair of series-connected n-channel hybrid FinFET transistors are connected to the second complementary output node;

a second pair of series-connected p-channel hybrid FinFET transistors connected between the first power supply node and the second complementary output node, wherein gates of the second pair of series-connected p-channel hybrid FinFET transistors are connected to the first complementary output node;

a second pair of series-connected n-channel hybrid FinFET transistors connected between the second power supply node and the second complementary output node, wherein gates of the second pair of series-connected n-channel hybrid FinFET transistors are connected to the first complementary output node;

an n-channel hybrid FinFET switch transistor having a gate connected to one of the first and second complementary output nodes;

a first n-channel hybrid FinFET select transistor coupled between the first complementary bit line and the first complementary output node, the first n-channel hybrid FinFET select transistor having a gate coupled to the word line; and a second n-channel hybrid FinFET select transistor coupled between the second complementary bit line and the second complementary output node, the second n-channel hybrid FinFET select transistor having a gate coupled to the word line; and the first and second pairs of n-channel hybrid FinFET select transistors each having a gate coupled to the word line wherein the first pair of series-connected p-channel hybrid FinFET transistors, the first pair of series-connected n-channel hybrid FinFET transistors, the second pair of series-connected p-channel hybrid FinFET transistors, the second pair of series-connected n-channel hybrid FinFET transistors, the first n-channel hybrid FinFET select transistor and the second n-channel hybrid FinFET select transistor include, have channels including channel implant doses in the entire channel that are higher than implant doses of the core logic FinFET transistor, have channel geometries that are approximately the same as a channel geometry of the core logic FinFET transistor, and include gate oxide layers having a uniform thickness across the entire channel that are approximately the same thicknesses as a gate oxide layer of the I/O FinFET transistor.

6. The static random-access memory configuration cell of claim 5 further comprising control circuitry configured to supply a programming potential to the first power supply node during a programming mode and supply an operating potential higher than the programming potential during a read mode.

7. The static random-access memory configuration cell of claim 5 wherein the n-channel hybrid FinFET switch transistor has a gate coupled to the second complementary output node.

* * * * *